United States Patent
Leobandung

(10) Patent No.: US 10,103,218 B1
(45) Date of Patent: Oct. 16, 2018

(54) DENSELY STACKED METAL-INSULATOR-METAL CAPACITOR AND METHOD OF FORMING THE SAME

(71) Applicant: INTERNATIONAL BUSINESS MACHINES CORPORATION, Armonk, NY (US)

(72) Inventor: Effendi Leobandung, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/470,554

(22) Filed: Mar. 27, 2017

(51) Int. Cl.
| | |
|---|---|
| H01L 49/02 | (2006.01) |
| H01L 27/08 | (2006.01) |
| H01L 23/522 | (2006.01) |
| H01L 23/532 | (2006.01) |
| H01L 21/768 | (2006.01) |
| H01L 21/3213 | (2006.01) |
| H01L 21/311 | (2006.01) |

(52) U.S. Cl.
CPC ........ *H01L 28/60* (2013.01); *H01L 21/31111* (2013.01); *H01L 21/3213* (2013.01); *H01L 21/76804* (2013.01); *H01L 21/76879* (2013.01); *H01L 23/5226* (2013.01); *H01L 23/5329* (2013.01); *H01L 27/0805* (2013.01)

(58) Field of Classification Search
CPC ...... H01L 28/40–28/92; H01L 29/7408; H01L 2924/1205; H01L 2924/19041; H01L 27/0288; H01L 27/0629; H01L 27/0635; H01L 27/0647–27/0652; H01L 27/067–27/0682; H01L 27/0711–27/0733; H01L 27/075–27/0755; H01L 27/0777; H01L 27/00
See application file for complete search history.

(56) References Cited

U.S. PATENT DOCUMENTS

2013/0038981 A1 *   2/2013  Imanaka ............. H01G 4/1227
                                                      361/301.4

* cited by examiner

*Primary Examiner* — Tucker J Wright
(74) *Attorney, Agent, or Firm* — F. Chau & Associates, LLC

(57) ABSTRACT

A metal-insulator-metal capacitor (MIM cap) includes a dielectric layer disposed over a substrate three contacts. A stacked structure of first and second metal layers separated by high-k dielectrics is disposed over the substrate and contacts. Three vias are formed through the structure to expose each of the three contacts. Selective etching is used to create gaps between the various metal layers at the location of the vias and these gaps are filled with an insulator. The vias are then filled with metal and the MIM cap is constructed such that the metal of the first via is electrically connected to the second metal layers and the metal of the second via is electrically connected to the first metal layers.

8 Claims, 10 Drawing Sheets

DENSELY STACKED METAL-INSULATOR-METAL CAPACITOR AND METHOD OF FORMING THE SAME

BACKGROUND

The present invention relates to metal-insulator-metal (MIM) capacitors and, more specifically, to densely stacked MIM capacitors (caps) and methods of forming the same.

Recently, advances have been made in combining metal circuit elements to semiconductor integrated circuits (ICs). These metal circuit elements may provide superior characteristics to circuit elements formed entirely by semiconductors. The use of MIM caps in advanced chips may significantly reduce noise.

As ICs do not offer a lot of surface area upon which metal circuit elements may be formed, it may be desirable to stack multiple MIM layers. However, fabrication of such devices may require many processing steps, such as repeated patterning and etching steps, thereby increasing the complexity and cost associated with the fabrication.

SUMMARY

A metal-insulator-metal capacitor includes a first contact, a second contact, and a third contact, each disposed within a substrate. A first dielectric layer is disposed over the substrate and the first, second, and third contacts. A stacked structure is disposed over the first dielectric layer. The stacked structure includes a repeating pattern of a second metal layer, a first metal layer, and a high-k dielectric disposed between the second metal layer and the first metal layer. A second dielectric layer is disposed over the stacked structure. A first via exposes the first contact through the first dielectric layer, the stacked structure, and the second dielectric layer. The first via is filled with metal. A second via exposes the second contact through the first dielectric layer, the stacked structure, and the second dielectric layer. The second via is filled with metal. A third via exposes the third contact through the first dielectric layer, the stacked structure, and the second dielectric layer. The third via is filled with metal. The second metal layer of each repeating pattern of the stacked structure is connected to the metal filling the first via, insulated from the metal filling the second via, and insulated from the metal filling the third via. The first metal layer of each repeating pattern of the stacked structure is insulated from the metal filling the first via, connected to the metal filling the second via, and insulated from the metal filling the third via.

A method for forming a metal-insulator-metal capacitor includes disposing a first dielectric layer on a substrate having a first contact, a second contact, and a third contact disposed therein. A stacked structure is disposed over the first dielectric layer. The stacked structure includes a repeating pattern of a second metal layer, a first metal layer, and a high-k dielectric disposed between the second metal layer and the first metal layer. A second dielectric layer is disposed over the stacked structure. A first via is created through the second dielectric layer, the stacked structure, and the first dielectric layer to expose the first contact. A second via is created through the second dielectric layer, the stacked structure, and the first dielectric layer to expose the second contact. A third via is created through the second dielectric layer, the stacked structure, and the first dielectric layer to expose the third contact. The first metal layers of the stacked structure are selectively etched through the first via and the third via to create ring-shaped voids. The ring-shaped voids of the first via and the third via are filled with an insulator. The second metal layers of the stacked structure are selectively etched through the second via and the third via to create ring-shaped voids. The ring-shaped voids of the second via and the third via are filled with an insulator. The first via, the second via, and the third via are filled with a metal.

A method for forming a metal-insulator-metal capacitor includes disposing a first dielectric layer on a substrate having a first contact, a second contact, and a third contact disposed therein. A first second-metal layer is disposed over the first dielectric layer. A first high-k dielectric layer is disposed over the first second-metal layer. A first first-metal layer is disposed over the first high-k dielectric layer. A second high-k dielectric layer is disposed over the first first-metal layer. A second second-metal layer is disposed over the second high-k dielectric layer. A third high-k dielectric layer is disposed over the second second-metal layer. A second first-metal layer is disposed over the third high-k dielectric layer. A second dielectric layer is disposed over the second first-metal layer. A first via is created through the first dialectic, the first second-metal layer, the first high-k dielectric layer, the first first-metal layer, the second high-k dielectric layer, the second second-metal layer, the third high-k dielectric layer, the second first-metal layer, and the second dielectric layer exposing the first contact. A second via is created through the first dialectic, the first second-metal layer, the first high-k dielectric layer, the first first-metal layer, the second high-k dielectric layer, the second second-metal layer, the third high-k dielectric layer, the second first-metal layer, and the second dielectric layer exposing the second contact. A third via is created through the first dialectic, the first second-metal layer, the first high-k dielectric layer, the first first-metal layer, the second high-k dielectric layer, the second second-metal layer, the third high-k dielectric layer, the second first-metal layer, and the second dielectric layer exposing the third contact. The first and second first-metal layers are selectively etched through the first via and the third via to remove a portion of the first and second first-metal layers through the first via and the third via. The removed portion of the first and second first-metal layers are filled with an insulator though the first via and the third via. The first and second second-metal layers are selectively etched through the second via and the third via to remove a portion of the first and second second-metal layers through the second via and the third via. The removed portion of the first and second second-metal layers are filled with an insulator though the second via and the third via. The first via, the second via, and the third via are filled with a metal.

BRIEF DESCRIPTION OF THE SEVERAL VIEWS OF THE DRAWINGS

A more complete appreciation of the present invention and many of the attendant aspects thereof will be readily obtained as the same becomes better understood by reference to the following detailed description when considered in connection with the accompanying drawings, wherein.

DETAILED DESCRIPTION

Figure 1:
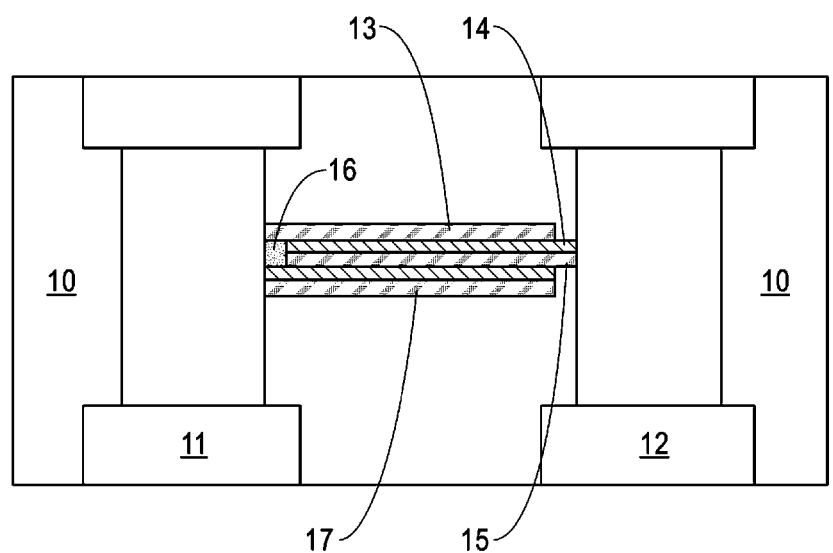
FIG. 1 is a diagram illustrating an existing MIM cap structure.

In describing exemplary embodiments of the present invention illustrated in the drawings, specific terminology is employed for sake of clarity. However, the present invention is not intended to be limited to the illustrations or any specific terminology, and it is to be understood that each element includes all equivalents.

Exemplary embodiments of the present invention pertain to a novel structure of a densely stacked metal-insulator-metal (MIM) capacitor (cap) and various methods for fabricating the MIM cap.

Existing MIM cap structures, such as that illustrated in FIG. 1 may have two metal contacts 11 and 12 that are formed on or within a semiconductor wafer 10. Electrodes may be formed, for example, including two top electrodes 13 and 17, as well as a middle electrode 15. Dielectric layers 14 and 16 may be formed between the electrodes and together, the electrodes and dielectric layers may form the MIM cap structure.

To fabricate such a structure, generally, the first top electrode 17 and the first dielectric layer 16 may be deposited, patterned, and etched. Then the middle electrode 15 and the second dielectric 14 may be deposited, patterned, and etched. Finally, the second top electrode 13 may be deposited, patterned, and etched. Accordingly, many patterning and etching steps are performed, particularly where there are more electrode and dielectric layers than are shown in this figure.

Figure 2:
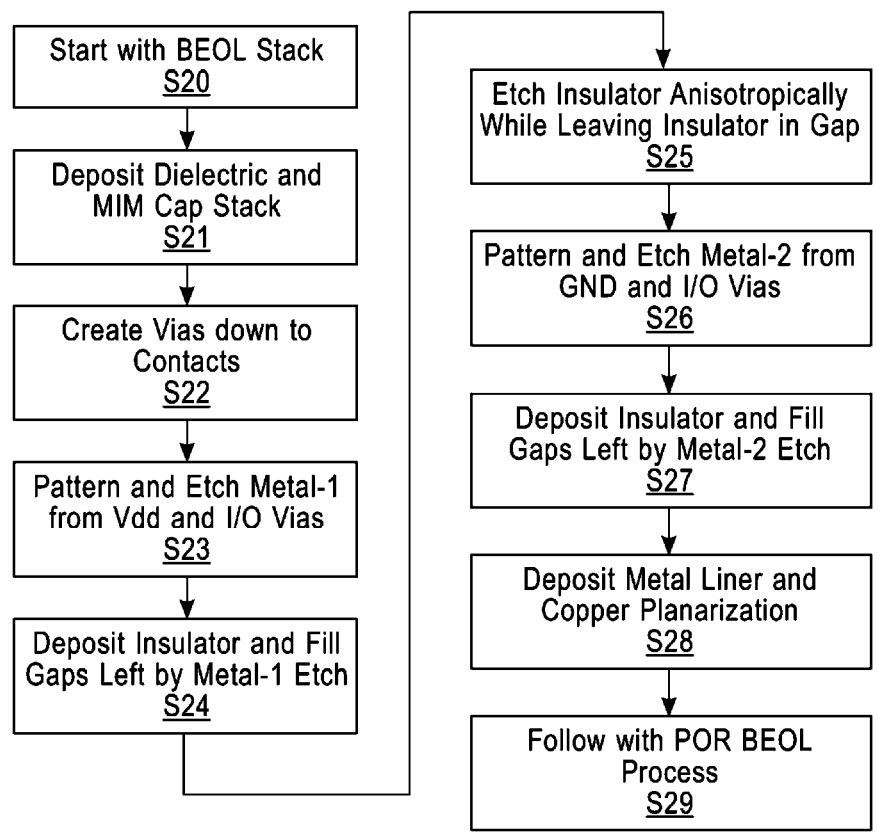
FIG. 2 is a flow chart illustrating a method for fabricating a densely stacked MIM cap structure in accordance with exemplary embodiments of the present invention.

Exemplary embodiments of the present invention may provide a densely stacked structure, where there are few patterning and etching steps, for example, only two masks might be needed, regardless of the number of electrode and dielectric layers within the structure. FIG. 2 is a flow chart illustrating a method for fabricating a densely stacked MIM cap in accordance with exemplary embodiments of the present invention, and FIGS. 3A though 3I are schematic diagrams showing the structure in various processing stages in accordance with exemplary embodiments of the present invention.

Figure 3A:
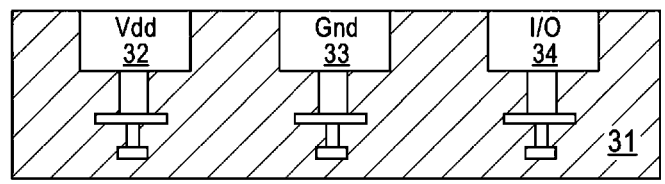
FIGS. 3A-3I are diagrams illustrating various processing steps for fabricating a densely stacked MIM cap structure in accordance with exemplary embodiments of the present invention.

Referring to FIG. 2 and FIG. 3A, the process may begin with a back end of line (BEOL) structure (Step S20) which may include a wafer or substrate 31 and various contacts such as a driving voltage (Vdd) contact 32, a ground (Gnd) contact 33, and an input/output (I/O) contact 34. The BEOL structure may be a far back end structure, which may be a higher-level structure where layers tend to be thicker.

Figure 3B:
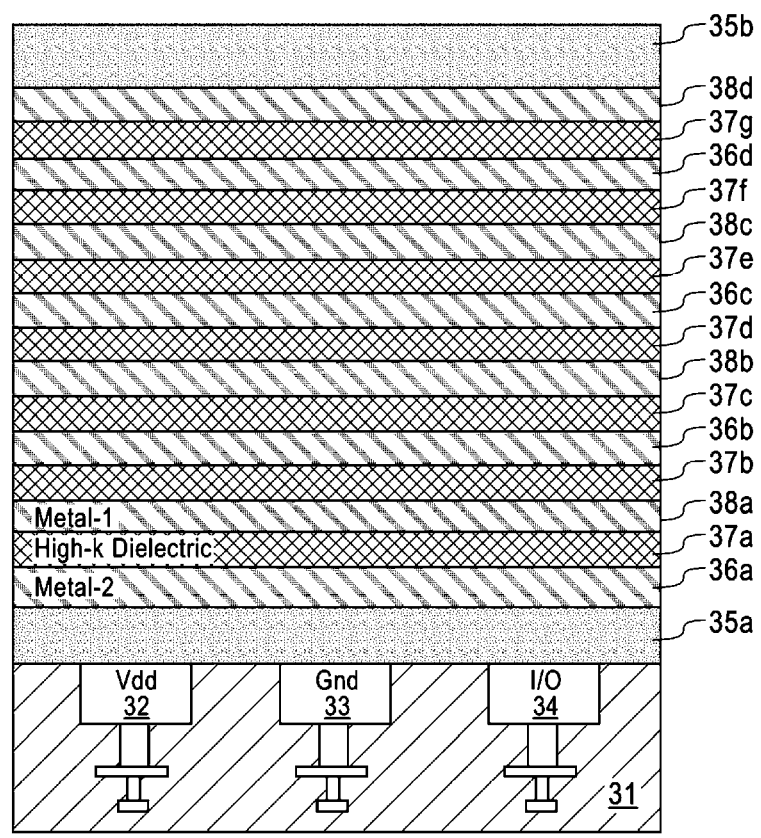

Next, as may be seen in FIG. 3B, the desired layers may be deposited upon the BEOL structure (Step S21). The deposited layers may include a first dielectric layer 35a and a second dielectric layer 35b, with a repeating set of layers sandwiched between the dielectric layers 35a. The repeating set of layers may include a first metal 38, a second metal 36, and a high-k dielectric layer 37 disposed therebetween.

While four repetitions of the set of layers are shown, it is to be understood that any desired number of repetitions may be used, for example, there may be only a single set of the first metal 38, second metal 36, and the high-k dielectric 37 disposed therebetween. However, there may alternatively be a plurality of repetitions, such as 2 repetitions, 3 repetitions, 4 repetitions (as shown), or more than 4 repetitions.

Additional repetitions may enlarge the structure and add to fabrication costs, however, additional repetitions may lead to lager capacitors. Thus, the demands of the integrated circuit design may determine how many repetitions to fabricate.

As mentioned above, each repetition may include a first metal 38, a second metal 36, and a high-k dielectric 37 disposed therebetween. As used herein, the term "high-k dielectric" is intended to mean a material with a greater dielectric constant than that of silicon dioxide. Examples of suitable high-k dielectric materials include, but are not limited to: hafnium silicate, zirconium silicate, hafnium dioxide and zirconium dioxide. The high-k dielectric layers 37 may be deposited using atomic layer deposition. The thickness of each high-k dielectric layer 37 may be within the range of 1-10 nm.

The first metal layers 38 and the second metal layers 36 may each be formed of copper, a copper alloy, or any other suitable electrically conductive metal. Each of these layers may have a thickness of 10-50 nm. The MIM cap is formed by each set of first and second metal layers with the high-k dielectric disposed therebetween.

In the exemplary structure shown, a first second-metal layer 36a is disposed over the first dielectric layer 35a. A first high-k dielectric layer 37a is disposed over the first second-metal layer 36a. A first first-metal layer 38a is disposed over the first high-k dielectric layer 37a. A second high-k dielectric layer 37b is disposed over the first first-metal layer 38a. A second second-metal layer 36b is disposed over the second high-k dielectric layer 37b. A third high-k dielectric layer 37c is disposed over the second second-metal layer 36b. A second first-metal layer 38b is disposed over the third high-k dielectric layer 37c. A fourth high-k dielectric layer 37d is disposed over the second first-metal layer 38b. A third second-metal layer 36c is disposed over the fourth high-k dielectric layer 37d. A fifth high-k dielectric layer 37e is disposed over the third second-metal layer 36c. A third first-metal layer 38c is disposed over the fifth high-k dielectric layer 37e. A sixth high-k dielectric layer 37f is disposed over the third first-metal layer 38c. A fourth second-metal layer 36d is disposed over the sixth high-k dielectric layer 37f. A seventh high-k dielectric layer 37g is disposed over the fourth second-metal layer 36d. A fourth first-metal layer 38d is disposed over the seventh high-k dielectric layer 37g. A second dielectric layer 35b is disposed over the fourth first-metal layer 38d.

It is to be understood that the first and second dielectric layers 35a and 35b may be formed of a substance, such as silicon dioxide, which is different than the high-k dielectric layers 37, however, any dielectric may do.

Figure 3C:
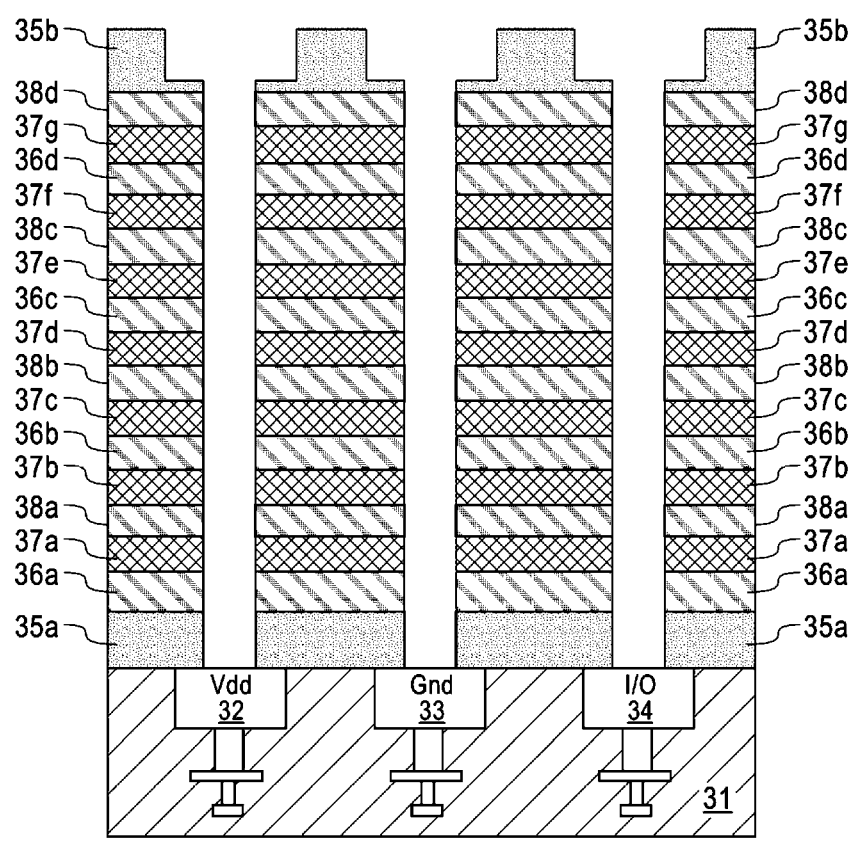

Next, as can be seen in FIG. 3C, vias may be formed within the stacked structure to expose each of the contacts, including the Vdd contact 32, the Gnd contact 33, and the I/O contact 34 (Step S22). These vias may be formed, for example, by etching.

Figure 3D:
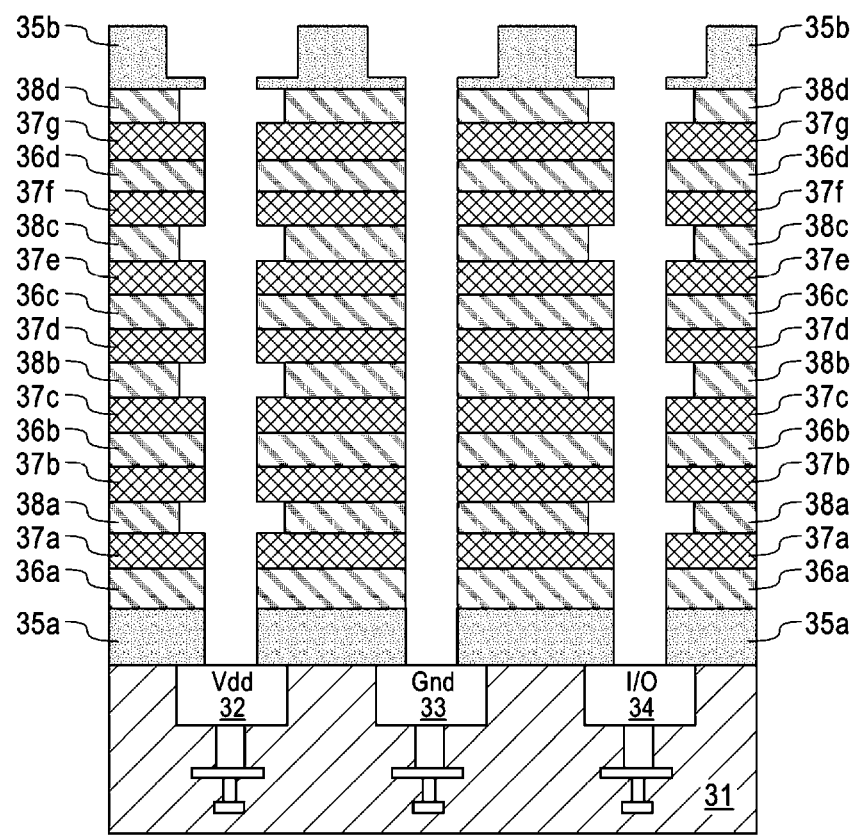

Next, as can be seen in FIG. 3D, the vias of the Vdd contact 32 and the I/O contact 34 may be patterned and further etched, for example, using an isotropic etching technique, to selectively etch into the first metal layers 38 (Step S23) creating a ring-shaped void at each first metal layer 38.

Figure 3E:
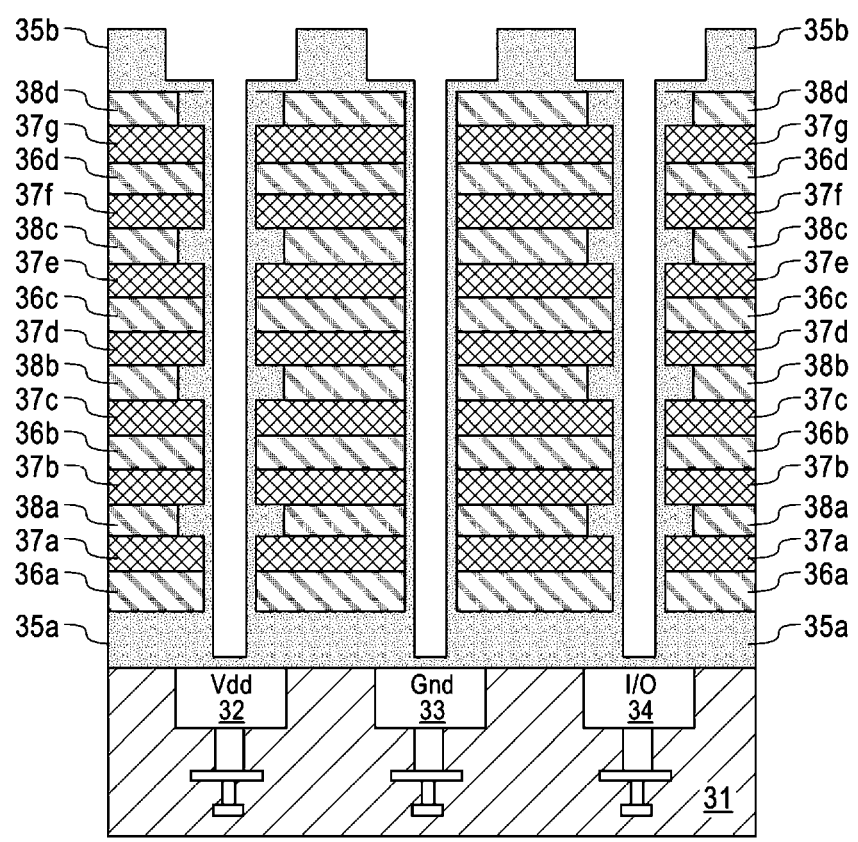

As can be seen from FIG. 3E, an insulator may then be deposited within each of the vias of the Vdd contact 32, the Gnd contact 33, and the I/O contact 34 (Step S24). This insulator may serve to fill the ring-shaped voids made by etching the first metal layers 38 within the vias of the Vdd contact 32 and the I/O contact 34. The via of the Gnd contact 33 may receive a coating of the deposited insulator.

Figure 3F:
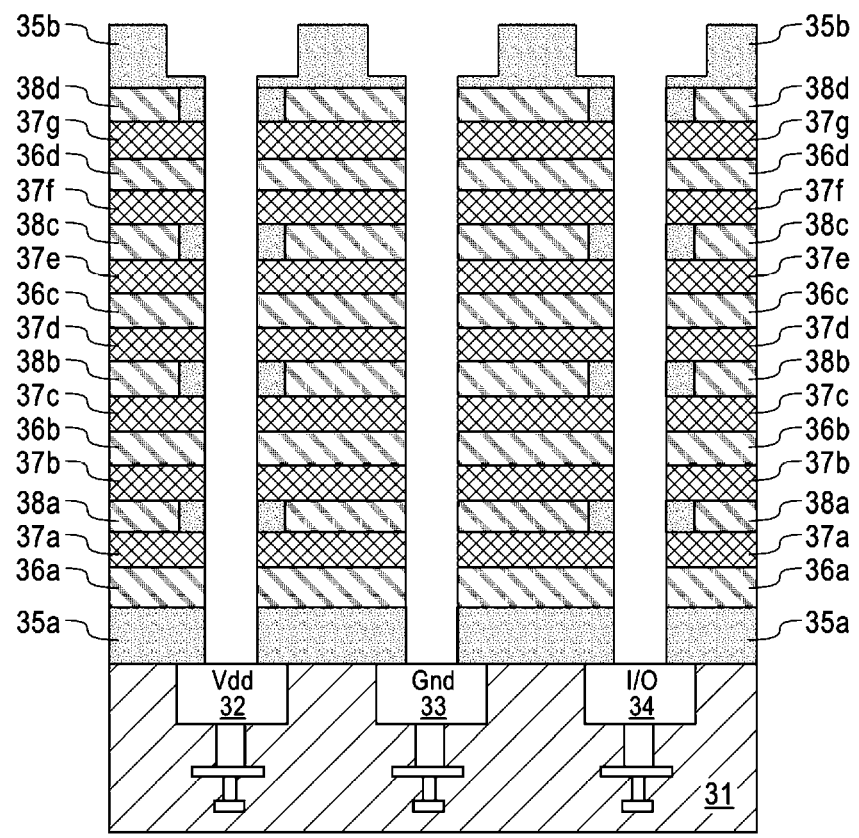

Next, as can be seen from FIG. 3F, the deposited insulator may then be anisotopically etched so as to remove the insulator from each of the vias but to leave the insulator within the ring-shaped voids (Step S25).

Figure 3G:
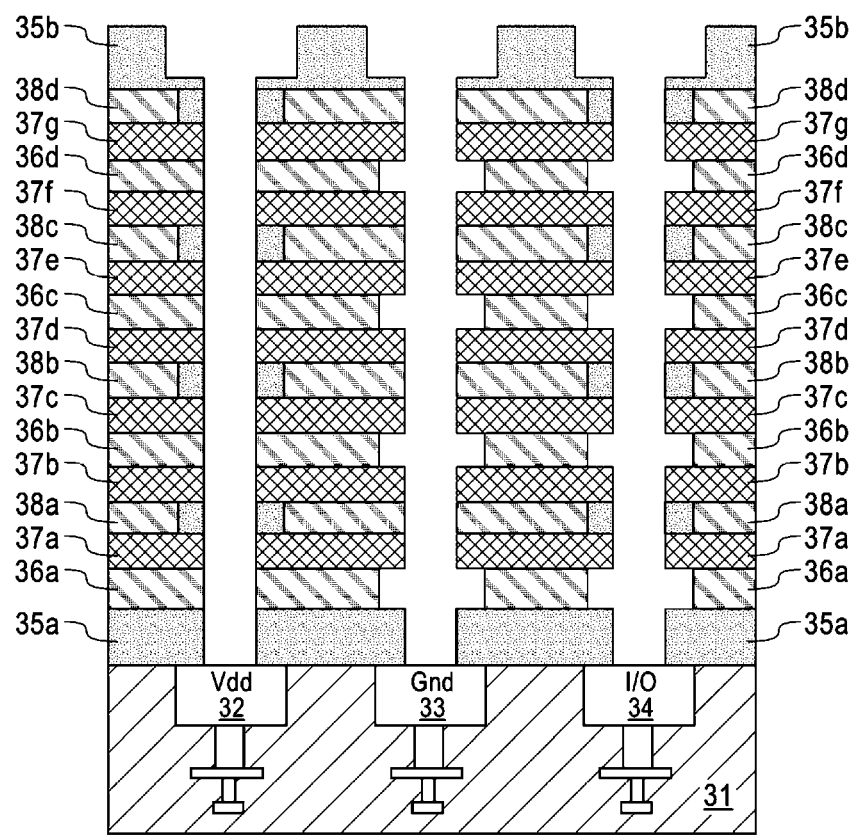
Figure 3H:
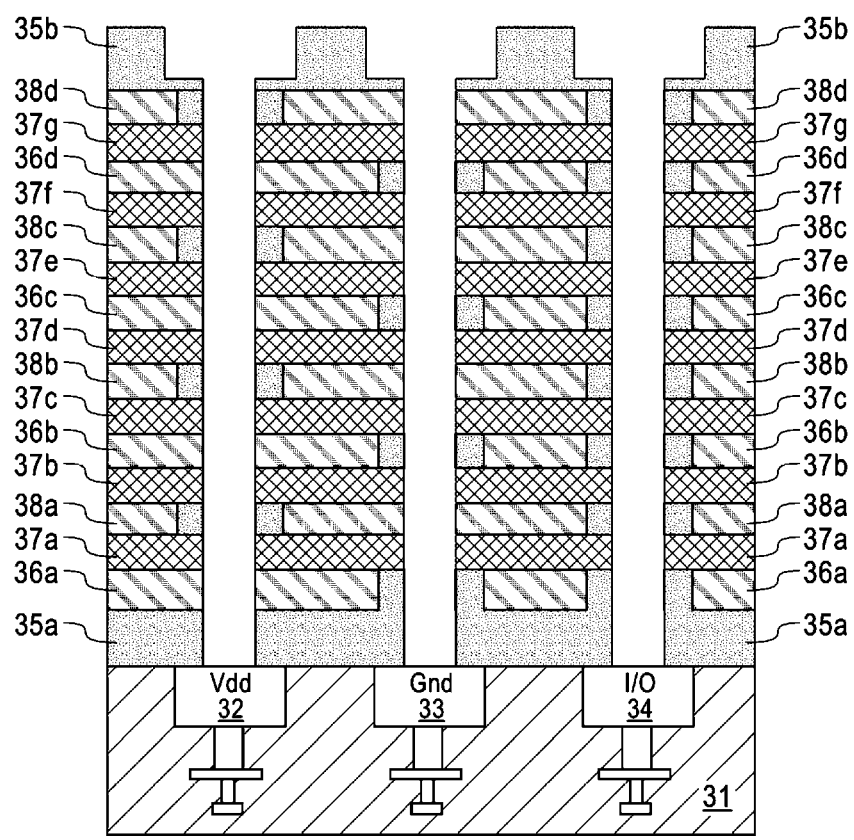

As can be seen from FIG. 3G, steps similar to steps S23, S24, and S25 may be performed for the second metal layers 36 (rather than for the first metal layers 38) and for the Gnd contact 33 via and the I/O contact 34 via (rather than for the Vdd contact 32 via and the I/O contact 34 via). In this way, the second metal layers 36 may be selectively etched isotopically so as to create ring-shaped voids at each of the second metal layers about the vias for the Gnd contact 33 and the I/O contact 34 (Step S26). Then, as can be seen in FIG. 3H, insulator may be deposited in each via so as to fill the ring-shaped voids in the second metal layers 36 for the vias of the Gnd contact 33 and the I/O contact 34 and then anisotopic etching may be performed to remove the insulator, but leaving the insulator in the ring-shaped voids (Step S27).

Figure 3I:
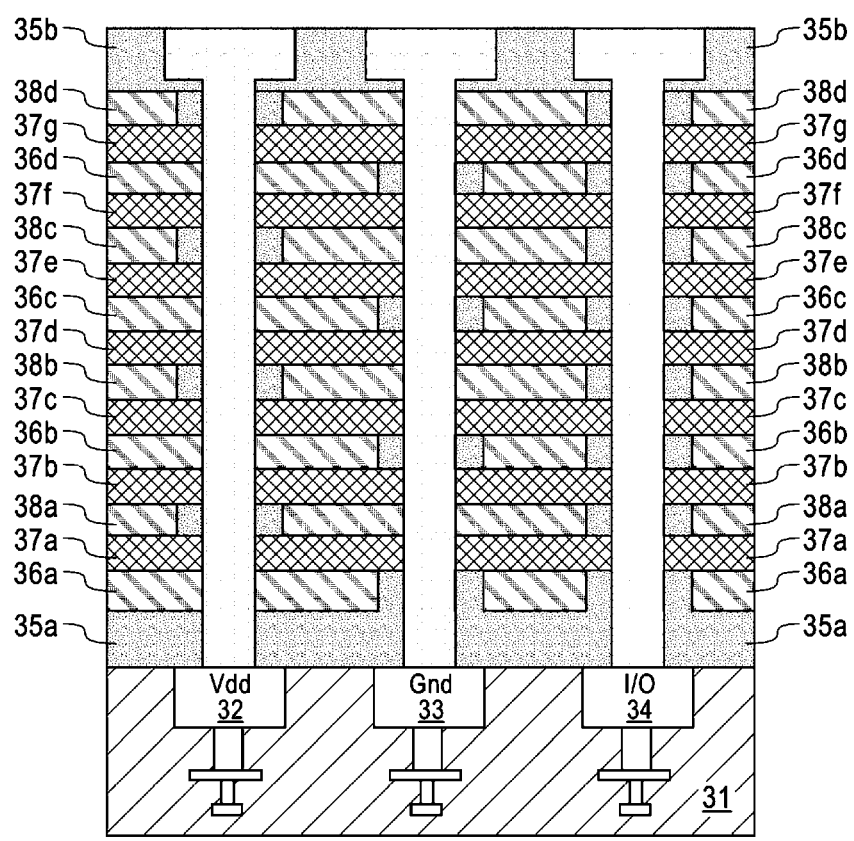

As can be seen from FIG. 3I, each of the vias may be filled with a metal such as copper (Step S28). This may be performed in three steps: the first step being to deposit a liner to line each via, the second step being to fill the lined vias with a metal such as copper, and the third step being to planarize the top surface of the structure. Thereafter, the remainder of the BEOL processing may be completed so that an integrated circuit (IC) may be formed to make use of the MIM cap so created (Step S29), for example, on a back end thereof.

As shown in FIG. 3I, the final structure has all second metal layers 36 connected with the metal-filled via of the Vdd contact 32, and all first metal layers 38 insulated from the metal-filled via of the Vdd contact 32 by insulating rings. Concurrently, all first metal layers 38 are connected with the metal-filled via of the Gnd contact 33, and all second metal layers 36 are insulated from the metal-filled via of the Gnd contact 33 by insulating rings. Concurrently, all first and second metal layers 38 and 36 are insulated from the metal-filled via of the I/O contact 34 by insulating rings.

Exemplary embodiments described herein are illustrative, and many variations can be introduced without departing from the spirit of the invention or from the scope of the appended claims. For example, elements and/or features of different exemplary embodiments may be combined with each other and/or substituted for each other within the scope of this invention and appended claims.

What is claimed is:

1. A metal-insulator-metal capacitor, comprising:
   a first contact, a second contact, and a third contact, each disposed within a substrate;
   a first dielectric layer disposed over the substrate and the first, second, and third contacts;
   a stacked structure disposed over the first dielectric layer, the stacked structure including repeating pattern of a second metal layer, a first metal layer, and a high-k dielectric disposed between the second metal layer and the first metal layer;
   a second dielectric layer disposed over the stacked structure;
   a first via exposing the first contact through the first dielectric layer, the stacked structure, and the second dielectric layer, the first via being filled with metal;
   a second via exposing the second contact through the first dielectric layer, the stacked structure, and the second dielectric layer, the second via being filled with metal; and
   a third via exposing the third contact through the first dielectric layer, the stacked structure, and the second dielectric layer, the third via being filled with metal,
   wherein the second metal layer of each repeating pattern of the stacked structure is connected to the metal filling the first via, insulated from the metal filling the second via, and insulated from the metal filling the third via, and
   wherein the first metal layer of each repeating pattern of the stacked structure is insulated from the metal filling the first via, connected to the metal filling the second via, and insulated from the metal filling the third via.

2. The metal-insulator-metal capacitor of claim 1, wherein the high-k dielectric layer of each repeating pattern of the stacked structure makes contact with the metal filling the first via, makes contact with the metal filling the second via, and makes contact with the metal filling the third via.

3. The metal-insulator-metal capacitor of claim 1, wherein the first contact is a driving voltage contact, the second contact is a ground voltage contact, and the third contact is an input/output contact.

4. The metal-insulator-metal capacitor of claim 1, wherein the first and second dielectric layers include silicon oxide and the high-k dielectric layer of each repeating pattern of the stacked structure is a dielectric having a dielectric constant greater than that of silicon oxide.

5. The metal-insulator-metal capacitor of claim 1, wherein the repeating pattern of the stacked structure is repeated at least two times.

6. The metal-insulator-metal capacitor of claim 1, wherein the repeating pattern of the stacked structure is repeated at least four times.

7. The metal-insulator-metal capacitor of claim 1, wherein both the first metal layer and the second metal layer of the repeating pattern of the stacked structure include copper.

8. The metal-insulator-metal capacitor of claim 1, wherein the first metal layer of the repeating pattern of the stacked structure have different etching susceptibilities than the second metal layer of the repeating pattern of the stacked structure.

* * * * *